United States Patent [19]

Meacham et al.

[11] Patent Number: 4,557,819
[45] Date of Patent: Dec. 10, 1985

[54] SYSTEM FOR IGNITING AND CONTROLLING A WAFER PROCESSING PLASMA

[75] Inventors: David D. Meacham, Redwood City; John J. Haruff, San Carlos, both of Calif.

[73] Assignee: Varian Associates, Inc., Palo Alto, Calif.

[21] Appl. No.: 632,783

[22] Filed: Jul. 20, 1984

[51] Int. Cl.[4] .............................................. C23C 15/00
[52] U.S. Cl. ................................ 204/298; 204/192 E; 156/345; 156/643
[58] Field of Search ............................. 156/643, 345; 204/192 E, 192 R, 298

[56] References Cited

U.S. PATENT DOCUMENTS

| 3,569,777 | 3/1971 | Beaudry | 156/643 |
|---|---|---|---|
| 3,616,405 | 10/1971 | Beaudry | 204/192 R |
| 3,704,219 | 11/1972 | McDowell | 204/298 |
| 3,767,551 | 10/1973 | Lang, Jr. et al. | 204/298 |
| 3,887,451 | 6/1975 | Cuomo et al. | 204/298 |
| 4,284,489 | 8/1981 | Weber | 204/298 |
| 4,284,490 | 8/1981 | Weber | 204/298 |
| 4,333,814 | 6/1982 | Küyel | 204/298 |
| 4,496,448 | 1/1985 | Tai et al. | 204/298 |

Primary Examiner—Andrew H. Metz
Assistant Examiner—Terryence Chapman
Attorney, Agent, or Firm—Stanley Z. Cole; Kenneth L. Warsh

[57] ABSTRACT

A circuit for impedance matching an RF source to a plasma load comprises an impedance magnitude control shunted with a parallel-resonant tank circuit to provide a phase control. A DC-blocking capacitor and RF filter are used to monitor the self-bias voltage on a workpiece in the plasma. An ignition control is used to provide prompt ignition of the plasma and a rotating magnet is used to stabilize the plasma.

3 Claims, 3 Drawing Figures

4,557,819

SYSTEM FOR IGNITING AND CONTROLLING A WAFER PROCESSING PLASMA

FIELD OF THE INVENTION

The invention pertains to a system for igniting and controlling a plasma and efficiently coupling energy into the plasma in an etching system or sputtering system for semiconductor wafer processing.

BACKGROUND OF THE INVENTION

In the processing of semiconductor wafers, plasmas are used for etching and sputtering. In batch processing systems, precision in starting and controlling the plasma has not been critical. Recently there has been a turn toward automated serial processing of wafers. Serial production has made timing of steps more critical, and automation has made independence of controls essential. Thus, it is becoming more important to provide systems which ignite a plasma quickly and control the power delivered precisely.

An impedance matching network is often used to efficiently couple the radio-frequency (RF) power into the plasma. The parameters of the matching network must be adjustable to permit tuning to compensate for shielding, wafer size, gas pressure and other changing parameters of the system. Matching networks in the prior art have reactance phase and impedance magnitude controls which are highly interdependent. This interdependence is undesirable for use in an automated system.

SUMMARY OF THE INVENTION

An object of the invention is to provide a system for coupling an RF source into an etching plasma or the like which is highly efficient and in which the phase and magnitude are independent of each other to facilitate automatic control. A further object is to provide timely ignition of the plasma together with a means for stabilizing the plasma.

These objects are achieved with a network in which the input power from the generator is applied through a variable capacitor. The adjustment of the variable capacitor is the impedance magnitude adjustment. The output from the first variable capacitor is connected in shunt with a parallel resonant tank circuit consisting of an inductor and a second variable capacitor. This second variable capacitor provides a reactance phase control. An RF blocking circuit is used to isolate the self-bias voltage. Timely ignition of the plasma is achieved by applying a high voltage DC field at the time the RF is applied. The plasma is stabilized by use of a rotating magnet above the substrate. The DC field and rotating magnet achieve sufficiently rapid ignition and high plasma stability to allow highly damped automatic controls to be applied to the matching network. The system achieves high power efficiency and simplicity thereby lowering construction and operating costs over the prior art. The simplicity of the system permits it to be closely coupled to the plasma, thereby achieving further improvements in efficiency.

These further constructional and operational characteristics of the invention will be more evident from the detailed description given hereinafter with reference to the figures of the accompanying drawings which illustrate preferred embodiments by way of non-limiting examples.

DESCRIPTION OF THE PREFERRED EMBODIMENT

Figure 1:
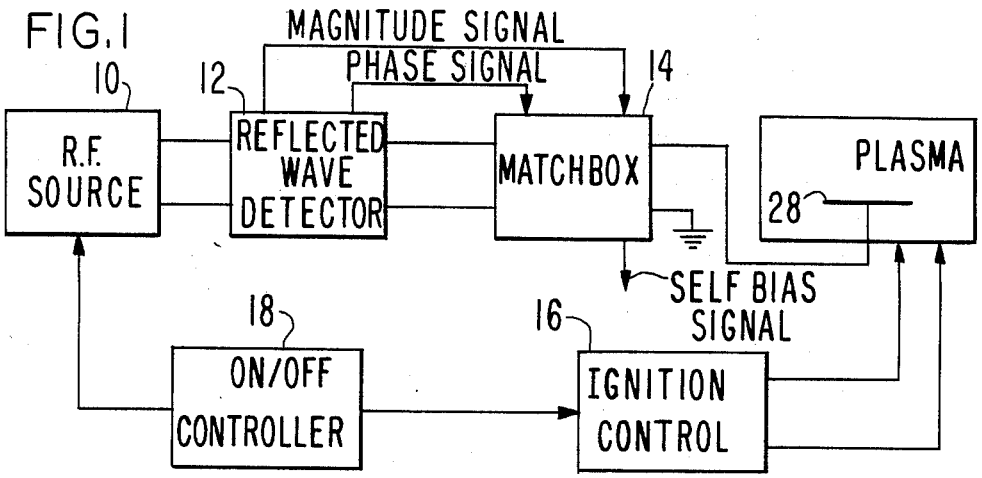
FIG. 1 is a block diagram of the system for igniting and controlling a plasma.

Referring now to the drawings wherein reference numerals are used to designate parts throughout the various figures thereof, there is shown in FIG. 1 a block drawing of the system.

The RF source 10 is connected to a reflected wave detector 12 which in turn is connected to the matchbox 14. Signals from the reflected wave detector are resolved into an impedance mismatch magnitude signal and an impedance mismatch phase signal which can then be fed into an automatic control through magnitude and phase drivers to the matchbox 14. In an alternate embodiment, the reflected wave signals can be displayed on dials and the matchbox can be manually tuned to a plasma matched condition using these displays for guidance. The matchbox 14 feeds the RF power to the plasma.

In order to insure that ignition of the plasma is timely, an ignition control 16 is used in combination with the RF source. An on/off controller 18 which may be part of a computer timing system energizes the RF source 10 at the same time the ignition control 16 is energized. The ignition controller can take many embodiments. For example, the pressure level of the gas used in etching or sputtering can be temporarily increased until the plasma ignites and then can be reduced to the optimum operating pressure. In another embodiment, electrodes in the vacuum chamber can be connected to an AC or DC power supply to generate a corona discharge to initiate ionization. In the preferred embodiment, we use a 5000 volt DC power supply which is connected to an electrode inside the region of the plasma to create an electric field which initiates the plasma.

Figure 2:
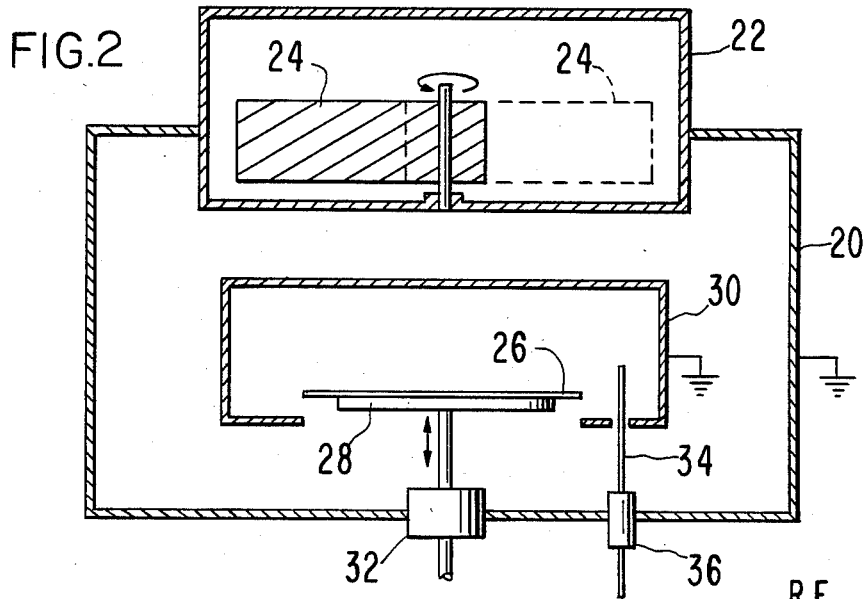
FIG. 2 is a schematic (not to scale) section of the wafer processing chamber.

In FIG. 2, there is shown a schematic sectional view (not to scale) through the vacuum chamber in an embodiment for ion etching. The vacuum chamber 20 includes a housing 22 for a rotating magnet 24. Housing 22 is made of non-magnetic material so fringing magnetic field lines will pass into the interior of chamber 20. Rotating magnet 24 is preferably of the type disclosed in U.S. Pat. No. 4,444,643, issued Apr. 24, 1984 to Charles B. Garrett. The wafer 26 is raised on an electrode pedestal 28 into position in a confinement shield 30. The confinement shield 30 is used to catch the particles removed from the surface of the wafer in the etching process. A feedthrough 32 is shown for the pedestal but the motion can be coupled into the vacuum chamber by other means. A wire 34 extending into the space occupied by the plasma is fed through the wall of the chamber 20 with a suitable feedthrough 36. The wire 34 is connected to the DC source in the ignition control. The confinement shield 30 and the vacuum chamber 20 are both grounded. When a voltage from ignition control 16 is impressed across the wire 34 and confinement shield 30, an electric field is generated between the confinement shield 30 and the wire 34 thereby stimulating the initiation of the plasma.

The RF source 10 typically generates power at 13.56 MHz but other frequencies can be used. An internal impedance of the power source of 50 ohms is typical and will be assumed in the following example.

Figure 3:
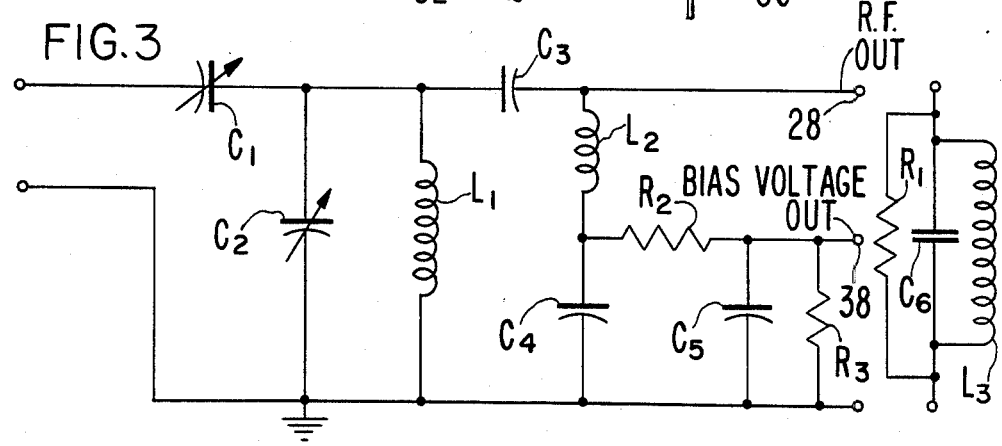
FIG. 3 is a schematic drawing of the matching network including a circuit for monitoring the self-bias voltage of a workpiece in the plasma.

As shown in FIG. 3, the magnitude control consists of a first capacitor $C_1$ in series with the input RF. $C_1$ is a variable capacitor having value 5-100 pf. The magnitude control steps up the 50-ohm input impedance to the load impedance, typically 1,100 ohms. A parallel-resonant tank circuit consisting of an inductor $L_1$ of about 1 microhenry and a second variable capacitor $C_2$ of value 5-100 pf is connected in shunt across the output of $C_1$ and the load. The plasma load is shown here as capacitor $C_6$ in parallel with inductor $L_3$ and resistor $R_1$. This parallel tank circuit provides a tuning ("phase") control and sets the operating "Q" of the circuit. Part of the equivalent capacitance of this tuned circuit is composed of the equivalent capacitance of $C_1$ and the RF source. Another part is composed of the load capacitance.

It is useful to monitor the self-bias voltage developed on the wafer table in the plasma. As shown in FIG. 3, a blocking capacitor $C_4$, typically 6800 pf at 2.5 Kv is included to isolate the bias voltage. A radio-frequency choke $L_2$, typically 44 microhenries, together with an RC filter and a voltage divider are used to bring out a pure DC bias level voltage. The capacitor $C_5$, typically 1000 pf at 5 Kv, resistor $R_2$, typically 10 Megohm, capacitor $C_6$, typically 0.001 microfarads, and $R_3$, typically 5K ohm are combined to form the RC filter and voltage divider. The bias voltage out at the terminal 38 is brought out to a suitable display (not shown).

Although an example for 13.56 MHz is shown, it should be clear to one of ordinary skill in the art how to change values of components for other frequencies.

An advantage of building a matchbox as shown in the preferred embodiment is that the matchbox is small, lightweight and inexpensive due to its simplicity. Because of this small size and light weight, the matchbox can be rigidly mounted to the etching or sputtering table thereby eliminating fatigue in a cable between the matchbox and a table moving relative to it. The small distance between the matchbox and the table has the additional advantage that the energy is thereby more efficiently coupled into the plasma. The independence of the impedance magnitude and phase controls facilitates automatic control. The prompt ignition and stable plasma achieved with the ignition control and rotating magnet permits precision timing in an automated process and allows use of a highly damped automatic control on the matchbox.

This invention is not limited to the preferred embodiments heretofore described, to which variations and improvements may be made without leaving the scope of protection of the present patent, the characteristics of which are summarized in the following claims.

What is claimed is:

1. A system for delivering RF power to a plasma for etching or coating a substrate comprising:
   an RF power generator;
   an impedance magnitude control including a first variable capacitor coupled in series with said power generator;
   an impedance phase control including an inductor connected in shunt across the output of said first variable capacitor and a second variable capacitor connected in shunt across said inductor;
   a plasma load connected in shunt across said second variable capacitor;
   a vacuum chamber for confining the plasma;
   an electrode for supporting a substrate for etching thereof by gas ions formed in the plasma, and said electrode and said chamber forming electrodes for said plasma;
   a shield wall in said chamber and around said substrate, said shield wall being electrically connected to said chamber; and
   a rotating magnet above the substrate surface to be etched.

2. A system as in claim 1 where said system includes a DC-blocking capacitor connected in series between said impedance magnitude and phase controls and said plasma load, and an RF-choke and RC filter connected in shunt across said plasma load whereby to monitor a self-bias voltage developed on a subject in said plasma load.

3. The system of claim 1 including a DC power supply connected to a pair of electrodes within the space of the plasma controlled such that an electric field is applied as the RF power is applied, whereby starting of the plasma is facilitated.

* * * * *